(12) United States Patent
Muck et al.

(10) Patent No.: US 7,042,964 B2
(45) Date of Patent: May 9, 2006

(54) VITERBI DECODER, METHOD AND UNIT THEREFOR

(75) Inventors: Markus Muck, Paris (FR); Ralf Hekmann, Ferney-Voltaire (FR)

(73) Assignee: Freescale Semiconductor, Inc., Austin, TX (US)

( * ) Notice: Subject to any disclaimer, the term of this patent is extended or adjusted under 35 U.S.C. 154(b) by 678 days.

(21) Appl. No.: 10/023,543

(22) Filed: Dec. 17, 2001

(65) Prior Publication Data

US 2002/0126776 A1 Sep. 12, 2002

(30) Foreign Application Priority Data

Dec. 29, 2000 (EP) .................................. 00403711

(51) Int. Cl.
  *H03D 1/00* (2006.01)
  *H04L 27/06* (2006.01)

(52) U.S. Cl. ........................................ 375/341; 714/795

(58) Field of Classification Search ................ 714/786, 714/792, 794, 795, 796; 375/262, 316, 341
See application file for complete search history.

(56) References Cited

U.S. PATENT DOCUMENTS

| | | | |
|---|---|---|---|
| 5,291,499 A * | 3/1994 | Behrens et al. ............. | 714/796 |
| 5,327,440 A * | 7/1994 | Fredrickson et al. ........ | 714/795 |
| 5,414,738 A * | 5/1995 | Bienz ......................... | 375/341 |
| 5,530,707 A * | 6/1996 | Lin ............................. | 714/792 |
| 5,742,621 A | 4/1998 | Amon et al. | |

(Continued)

FOREIGN PATENT DOCUMENTS

FR 2 769 434 A1 4/1999

OTHER PUBLICATIONS

Syed Shahzad, Saqih Yaqub, and Faiseal Suleman, Chameleon Logics; "Self Correcting Codes Conquer Noise—Part One: Viterbi Codecs" Feb. 15, 2001; EDN Magazine; pp. 131-140.*

(Continued)

*Primary Examiner*—Mohammad Ghayour
*Assistant Examiner*—Krista M. Flanagan

(57) ABSTRACT

A Viterbi decoder includes a number of classical Add-Compare-Select units and a number of further Add-Compare-Select unit having a lower complexity butterfly unit (300) having only two adder means, such that the further Add-Compare-Select unit has a butterfly unit (300) comprising: first adder means (310) for receiving a first path metric and a branch metric and for producing at its output the addition thereof; and second adder means (320) for receiving a second path metric and said branch metric and for producing at its output the addition thereof. First comparator means (330) are coupled to receive the output of the second adder means and coupled to receive the first path metric for comparing therebetween. Second comparator means (340) are coupled to receive the output of the first adder means and coupled to receive the second path metric for comparing therebetween. First selection means (350) for selecting between the second adder means output and the first path metric produce a first survivor path metric in dependence on the first comparator means comparison. Second selection means (360) for selecting between the first adder means output and the second path metric signal produce a second survivor path metric in dependence on the second comparator means comparison. Only two adder means are used for processing metric transitions as a second branch metric is identified as having a value of zero.

11 Claims, 4 Drawing Sheets

U.S. PATENT DOCUMENTS

| | | | |
|---|---|---|---|
| 5,815,515 A * | 9/1998 | Dabiri | 714/795 |
| 5,928,378 A * | 7/1999 | Choi | 714/795 |
| 5,970,097 A * | 10/1999 | Ishikawa et al. | 375/262 |
| 6,163,581 A * | 12/2000 | Kang | 375/341 |
| 6,334,202 B1 * | 12/2001 | Pielmeier | 714/795 |
| 6,553,541 B1 * | 4/2003 | Nikolic et al. | 714/795 |
| 6,697,443 B1 * | 2/2004 | Kim et al. | 375/341 |
| 2001/0007142 A1 * | 7/2001 | Hocevar et al. | 714/795 |

OTHER PUBLICATIONS

European Search Report dated Mar. 6, 2001 (3 pgs.).

* cited by examiner

BUTTERFLY TYPE I

BUTTERFLY TYPE II

BUTTERFLY TYPE III

BUTTERFLY TYPE IV

VITERBI DECODER, METHOD AND UNIT THEREFOR

FIELD OF THE INVENTION

This invention relates to Viterbi decoding. Viterbi decoding is commonly used in the receiving side of digital communication systems where potentially disrupted signals (e.g., disrupted by a fading channel, noise, etc.) must be decoded. Such signals are typically the result of bit-streams that have been encoded using convolutional codes and modulated for transmission, and such received encoded signals are typically decoded using a maximum-likelihood algorithm, generally based on the 'Viterbi algorithm'.

BACKGROUND OF THE INVENTION

In considering the Viterbi algorithm, two aspects in particular must be considered: the 'Metric Calculation' and the 'Viterbi decoder' itself. The theory of both of these aspects, involving calculation of branch, node and path metrics between different trellis nodes, is well known and ubiquitously applied in the field of digital communications.

The main problem of the Viterbi algorithm lies in its arithmetical decoding complexity (thus leading to high power consumption, etc., which is a paramount consideration in battery-operated portable communication devices). A lot of research has been done with the aim of reducing complexity associated with the Viterbi algorithm.

However, this research has invariably not taken into account the needs of 'broadband communications' systems. In these systems account must be taken of the very high bit rates involved, which require adaptation of the Viterbi algorithm for efficient maximum-likelihood decoding.

Standard implementations of the Viterbi algorithm are distinctly sub-optimum for 'Broadband Communication' systems because:

1) In the Viterbi decoder the arithmetically most complex part is the "Addition-Compare-Select (ACS) Unit" which is re-used several times during each decoding step. The vast majority of existing solutions propose to implement this "Addition Compare Select Unit" once (e.g., on an application specific integrated circuit (ASIC)) and to re-use it each time it is needed. Of course, this slows down the decoding compared to a fully parallel implementation. In "Broadband Communications" systems, however, there is a very high bit-rate and the re-use of blocks is often impossible due to clock frequency restrictions. In other words, a fully parallel implementation is often required which allows the decoding of one bit per clock cycle. Sometimes a partly parallel implementation is sufficient, representing a trade-off between the two extremes.

2) The standard proposed metrics allow little or no opportunity for varying the layout or configuration of a fully (or partly) parallel ASIC implementation, and although some suggestion has been made to vary the standard metrics these variations are still undesirably complex and sub-optimal for use in broadband communications implementations.

A need therefore exists for a Viterbi decoder, unit therefor and method wherein the abovementioned disadvantage(s) may be alleviated.

STATEMENT OF INVENTION

In accordance with a first aspect of the present invention there is provided a Viterbi decoder as claimed in claim 1.

In accordance with a second aspect of the present invention there is provided a method of producing metrics, for use in a Viterbi decoder, as claimed in claim 4.

In accordance with a third aspect of the present invention there is provided a butterfly unit, for use in a Viterbi decoder Add-Compare-Select unit, as claimed in claim 11.

BRIEF DESCRIPTION OF THE DRAWINGS

One Viterbi decoder incorporating the present invention will now be described, by way of example only, with reference to the accompanying drawing(s), in which.

DESCRIPTION OF PREFERRED EMBODIMENT(S)

The following description, explanation and associated drawings are based (for the sake of example) on use of an encoder whose code rate is of the type $R=1/m$, with m integer. However, it will be understood that the invention is not limited to such an encoder type and may be more generally applied, e.g., to cases of code rate type $R=k/m$, where $k$ (>1) and m are integer.

Figure 1:
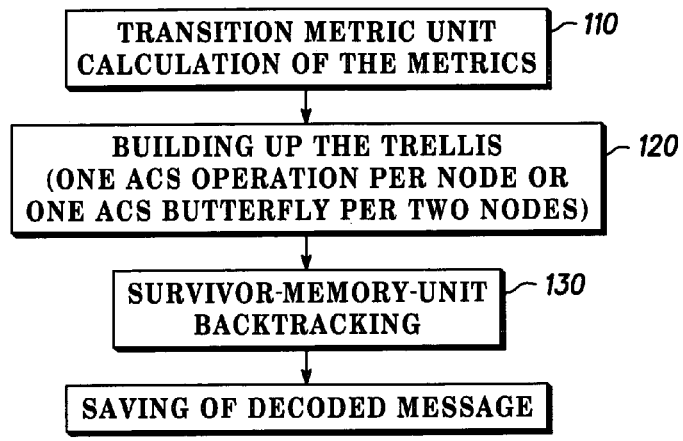
FIG. 1 shows a block schematic representation of a classical implementation of the Viterbi algorithm.

Convolutional codes are commonly used in digital communication systems in order to encode a bit-stream before transmission. In the receiver, a deconvolution has to be performed on the received symbols that have been possibly corrupted by fading due to a multipath channel and by additive noise. A classical implementation of the Viterbi algorithm, as shown in FIG. 1, to perform a Maximum-Likelihood decoding of the received data consists of three blocks:

Transition Metric Unit (TMU, calculation of the metrics)—block 110

Addition-Compare-Select Unit (ACS, accumulation of path metrics)—block 120

Survivor-Memory Unit (SMU, processing of the decisions made and output of decoded data)—block 130

The present invention concerns techniques for reducing the complexity of a Viterbi decoder.

Briefly stated, the present invention provides a new ACS unit that may be used at certain positions in a Viterbi decoder to simplify the processing required, and provides certain new metrics for use with the new ACS units to decrease the overall complexity of Viterbi decoding.

Figure 2:
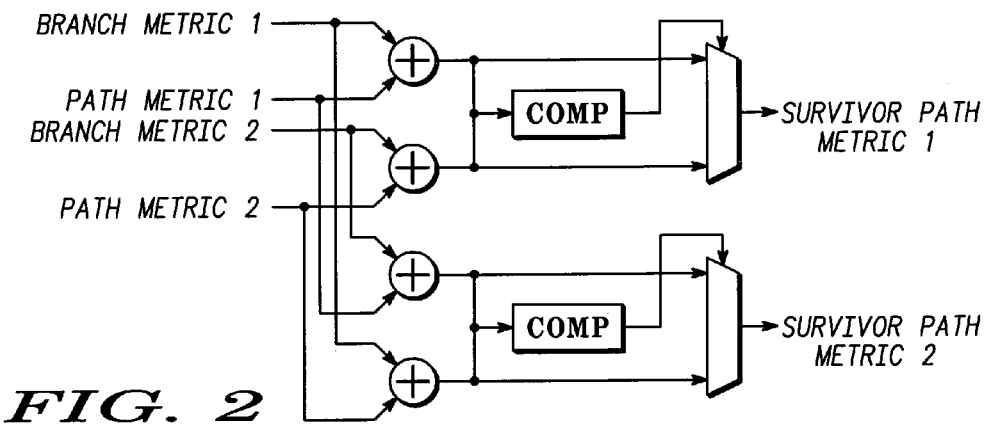
FIG. 2 shows a schematic representation of a classical ACS 'butterfly' unit.

The critical element in a Viterbi decoder is usually the ACS unit, of which a typical example is shown in FIG. 2. Generally, $$\frac{N}{2}$$

ACS butterfly operations have to be performed per trellis transition if a N-state convolutional encoder is used. In a high-speed application, all $$\frac{N}{2}$$

or at least some $$\left(\text{for example, a number } P \text{ between } 1 \text{ and } \frac{N}{2}\right)$$

ACS butterflies have to work in parallel, requiring an important amount of chip surface in the case of a hardware implementation. Consequently, the power consumption of the ACS units is important compared to the total consumption of the decoder.

For the 'HIPERLAN/2' standard, for example, massive parallel structures are necessary in order to guarantee the required bit-rates (up to 54 MBits/s. Even if all ACS units are working in parallel in order to decode 1 bit per clock cycle, a minimum clock speed of 54 MHz is mandatory.

Figure 3:
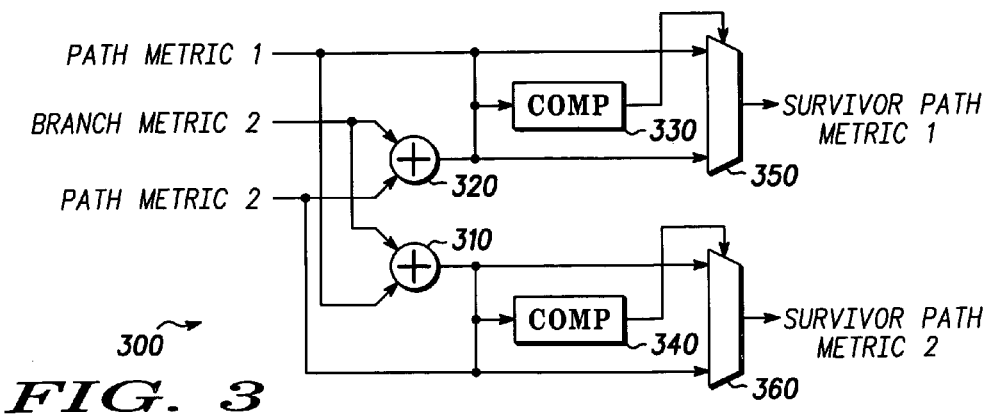
FIG. 3 shows a schematic representation of a new ACS 'butterfly' unit in accordance with the invention.
Figure 4A:
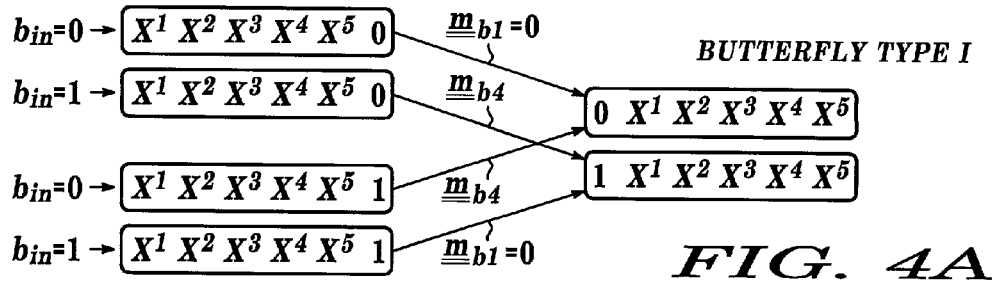
FIG. 4 shows functional representations of four types of ACS 'butterfly' units which may be used in a Viterbi decoder in accordance with the invention.
Figure 4B:
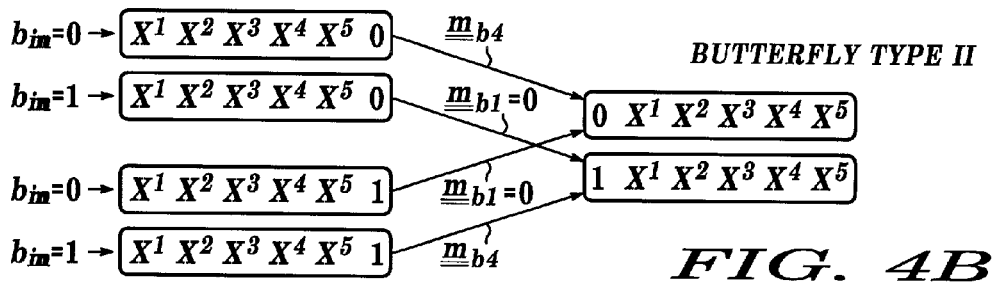
Figure 4C:
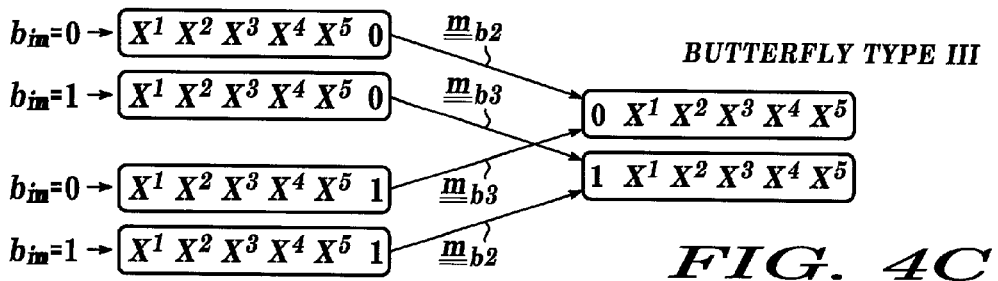
Figure 4D:
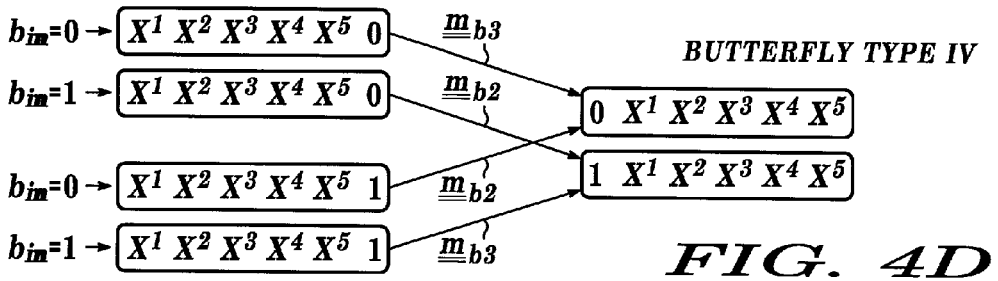
Figure 5A:
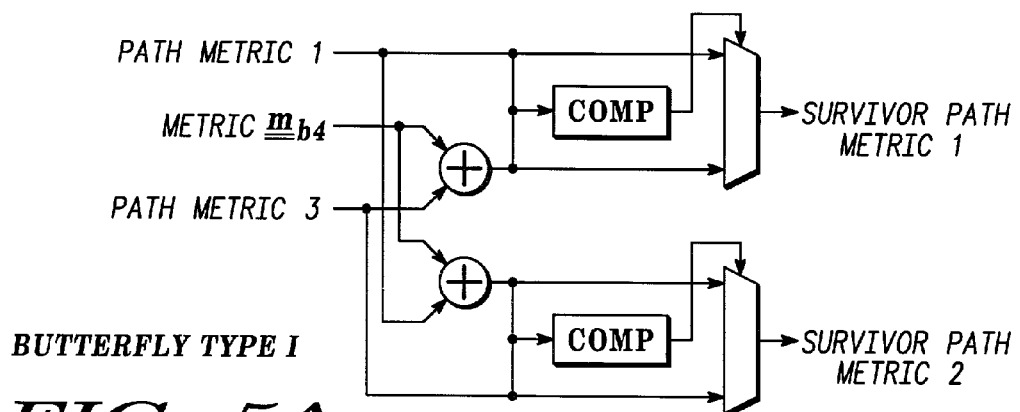
FIG. 5 shows schematic representations of implementations of the four types of ACS 'butterfly' units of FIG. 4
Figure 5B:
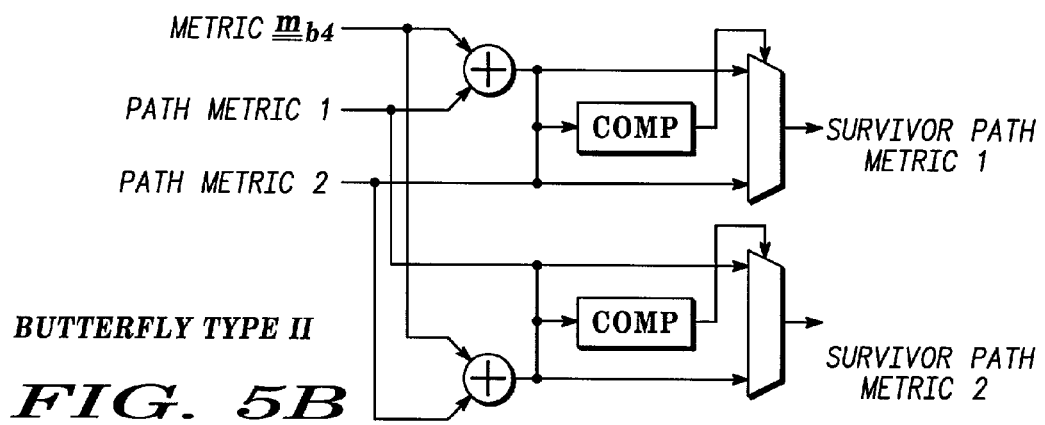
Figure 5C:
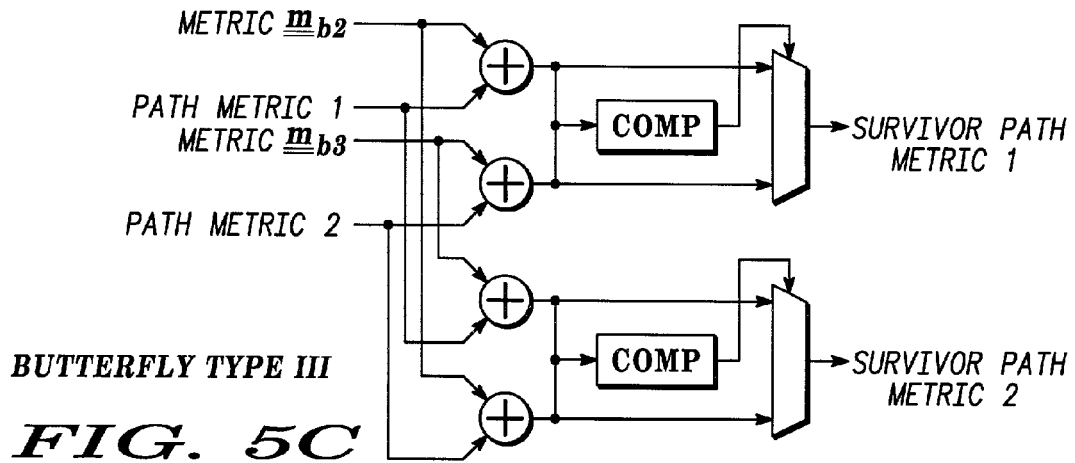
Figure 5D:
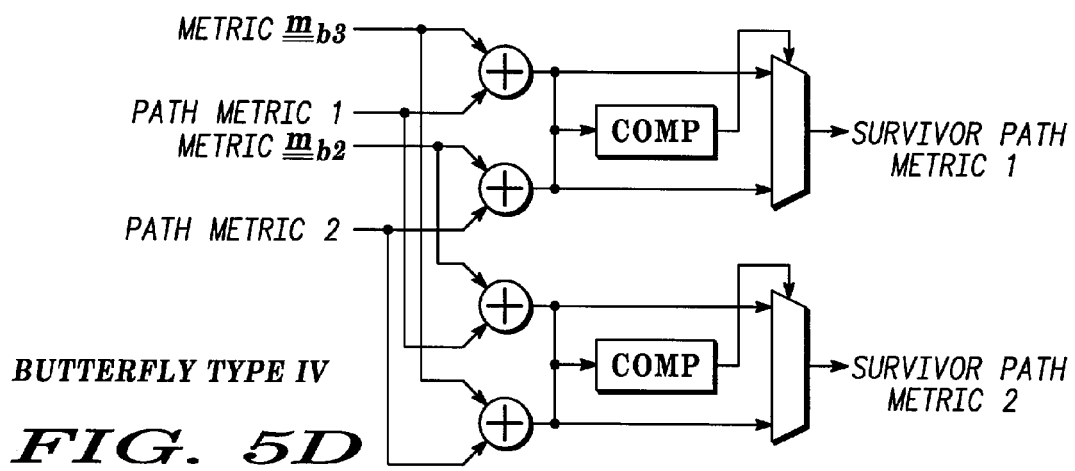

In order to reduce the complexity of Viterbi decoding, the following is proposed:

Instead of implementing P times the same butterfly, two different butterfly types may be used: one being the classical butterfly using four internal adders (as shown in FIG. 2), and the other being a new butterfly arrangement (as shown in FIG. 3) which uses only two internal adders. Since the addition is generally the most complex function in the ACS Unit, the complexity and consumption are reduced by approximately one fourth for the new butterfly type compared to the classical one (although the number of adders is reduced by half, the overall complexity is reduced by the lesser amount of one fourth since the number of comparators and multiplexers is not reduced).

Determining (as will be explained below) when the classical butterfly has to be used and when the new, less complex butterfly can be used instead.

Using metrics of certain properties (as will also be explained below) which are required by the new butterfly types.

Following these proposals produces the advantages that:

The complexity of the Viterbi decoder is reduced. The total saving in surface/complexity/power-consumption depends on the type of the convolutional code. For example, for a coding rate $$R = \frac{1}{2}$$

(this type of code rate, together with a constraint length of K=7, leads to a convolutional code that is commonly used, for example by the 'BRAN HIPERLAN/2' standard), 50% of all classical butterflies can be substituted by the optimised ones leading to approximately 8% gain in surface/complexity compared to that of a Viterbi decoder using only the conventional butterfly configuration.

The method is suitable for both hardware (e.g., in an ASIC) and software (e.g., on a DSP) implementation.

The method can be combined with known Viterbi-implementation methods. For example, metric normalisation (as has been proposed elsewhere) can reduce the size of the branch metrics.

The method can be used for different coding rates, but the gain decreases exponentially with m as a function of the general coding rate R=k/m, where m and k are integer.

Not all $$\frac{N}{2}$$

ACS butterflies must be implemented. It is possible to find hybrid structures where a number of butterflies between 1 and $$\frac{N}{2}$$

are implemented and reused once or several times per transition. So, a trade-off is possible between decoding speed and chip surface in a hardware implementation.

The proposed method does not decrease the performance of the Viterbi algorithm compared to a classical implementation. The required calculation precision (number of bits for metrics and adders) is not increased by the new method if certain rules (as will be explained below) are respected. Moreover, the complexity of the metric calculation block will not be increased, but slightly reduced if the rules are respected.

As a result, a complexity-optimised Viterbi decoder can be implemented in hardware that decodes one output-information bit per clock cycle and is thus suitable for broadband communications applications since it is power- and processor-efficient.

The following discussion explains adaptation of metrics in general to suit the new ACS butterfly unit of FIG. 3. As can be seen, in the form shown in FIG. 3 the new butterfly unit 300 has one adder 310 for adding the path metric 1 and branch metric 2, and another adder 320 for adding the path metric 2 and branch metric 2. A comparator 330 compares the output of the adder 320 and the path metric 1, and a comparator 340 compares the output of the adder 310 and the path metric 2. A selector 350 selects between the output of the adder 320 and the path metric 1, dependent on the comparator 330, to produce the survivor path metric 1; a selector 360 selects between the output of the adder 310 and the path metric 2, dependent on the comparator 340, to produce the survivor path metric 2. It is to be noted that only one branch metric value (as shown, branch metric 2) is used in the butterfly unit 300.

Considering a convolutional encoder based on a code rate $$R = \frac{1}{m}$$

with m integer, m encoded bits are output by the encoder at each transition. These m bits appear in the decoder as metrics $m_1(\text{bit}=0)$, $m_1(\text{bit}=1)$, $m_2(\text{bit}=0)$, $m_2(\text{bit}=1)$, . . . , $m_m$(bit=0), $m_m$(bit=1). Per trellis transition, there are $l=2^m$ different branch metrics possible:

$$m_{b1} = m_1(bit=0) + m_2(bit=0) + \ldots + m_m(bit=0)$$

$$m_{b2} = m_1(bit=1) + m_2(bit=0) + \ldots + m_m(bit=0)$$

$$\ldots$$

$$m_{bl} = m_1(bit=1) + m_2(bit=1) + \ldots + m_m(bit=1)$$

Assuming that positive and negative branch metrics are possible, any branch metric $m_{ba} \in (m_{b1}, m_{b2}, \ldots, m_{bl})$ may be chosen and subtracted from all other branch metrics. The new resulting branch metrics are thus:

$$\underline{m}_{b1} = m_{b1} - m_{ba} = m_1(bit=0) + m_2(bit=0) + \ldots + m_m(bit=0) - m_{ba}$$

$$\underline{m}_{b2} = m_{b2} - m_{ba} = m_1(bit=1) + m_2(bit=0) + \ldots + m_m(bit=0) - m_{ba}$$

$$\ldots$$

$$\underline{m}_{ba} = m_{ba} - m_{ba} = 0$$

$$\ldots$$

$$\underline{m}_{bl} = m_{bl} - m_{ba} = m_1(bit=1) + m_2(bit=1) + \ldots + m_m(bit=1) - m_{ba}$$

Considering now the inputs to the ACS unit, there are in any case two path (or node) metrics $M_{node1}$ and $M_{node\ 2}$ as well as two branch metrics $m_{branch1} \in (\underline{m}_{b1}, \underline{m}_{b2}, \ldots, \underline{m}_{bl})$ and $m_{branch2} \in (\underline{m}_{b1}, \underline{m}_{b2}, \ldots, \underline{m}_{bl})$ at the input of the ACS unit. Two cases have to be considered separately:

$m_{branch1} \neq 0$ and $m_{branch2} \neq 0$: The classical ACS unit (see FIG. 2) is used.

$m_{branch1} = 0$ or $m_{branch2} = 0$: The new ACS unit (see FIG. 3) is used, since an addition by 0 does not require an adder.

This rule is based on the typically valid observation that the encoder output bits remain unchanged if both, the input bit to the encoder and the most significant bit (MSB) of the encoder state are inverted.

In general, this method has the disadvantage that the resulting metrics $\underline{m}_{b1}, \underline{m}_{b2}, \ldots, \underline{m}_{bl}$ might have a larger dynamic range than the classical metrics $m_1, m_2, \ldots, m_l$. However, the following discussion progresses from the above general case to a slightly specialised case where this disadvantage is resolved.

The only restriction that is imposed on the metrics in the following specialisation is $$m_a(bit=0) = -m_a(bit=1) \ \forall a$$

where the expression "$\forall a$" stands for "for all valid a". That is to say, assuming a bit "0" has been sent, a metric "$m_a(bit=0)$" is produced. The metric corresponding to the assumption that a bit "1" has been sent instead is simply calculated by multiplying the previous result by "−1". This is valid for "all valid a".

Now, the $l=2^m$ different branch metric can be presented as follows:

$$m_{b1} = m_1(bit=0) + m_2(bit=0) + \ldots + m_m(bit=0)$$

$$m_{b2} = -m_1(bit=0) + m_2(bit=0) + \ldots + m_m(bit=0)$$

$$\ldots$$

$$m_{bl} = -m_1(bit=0) - m_2(bit=0) - \ldots - m_m(bit=0)$$

If any metric $m_{ba} \in (m_{b1}, m_{b2}, \ldots, m_{bl})$ is chosen among them and subtracted from all metrics $m_{b1}, m_{b2}, \ldots, m_{bl}$, the resulting metrics $\underline{m}_{b1}, \underline{m}_{b2}, \ldots, \underline{m}_{bl}$ are $$\underline{m}_{=b1} = \begin{Bmatrix} +2m_1(bit=0) \\ -2m_1(bit=0) \\ 0 \end{Bmatrix} + \begin{Bmatrix} +2m_2(bit=0) \\ -2m_2(bit=0) \\ 0 \end{Bmatrix} + \ldots + \begin{Bmatrix} +2m_l(bit=0) \\ -2m_l(bit=0) \\ 0 \end{Bmatrix}$$

$$\underline{m}_{=b2} = \begin{Bmatrix} +2m_1(bit=0) \\ -2m_1(bit=0) \\ 0 \end{Bmatrix} + \begin{Bmatrix} +2m_2(bit=0) \\ -2m_2(bit=0) \\ 0 \end{Bmatrix} + \ldots + \begin{Bmatrix} +2m_l(bit=0) \\ -2m_l(bit=0) \\ 0 \end{Bmatrix}$$

$$\ldots$$

$$\underline{m}_{=bl} = \begin{Bmatrix} +2m_1(bit=0) \\ -2m_1(bit=0) \\ 0 \end{Bmatrix} + \begin{Bmatrix} +2m_2(bit=0) \\ -2m_2(bit=0) \\ 0 \end{Bmatrix} + \ldots + \begin{Bmatrix} +2m_l(bit=0) \\ -2m_l(bit=0) \\ 0 \end{Bmatrix}$$

Each contribution $\pm m_x(bit=0)$ is either multiplied by 2 or set to 0. Since all metrics can be multiplied by a constant factor without changing the decision path of the Viterbi decoder, $\underline{m}_{b1}, \underline{m}_{b2}, \ldots, \underline{m}_{bl}$ shall be multiplied by $$\frac{1}{2}.$$

Then, we find $l=2^m$ new metrics adapted to the new ACS units that require neither more complex metric calculation nor a higher dynamic range:

$$\underline{m}_{=b1} = \begin{Bmatrix} +m_1(bit=0) \\ -m_1(bit=0) \\ 0 \end{Bmatrix} + \begin{Bmatrix} +m_2(bit=0) \\ -m_2(bit=0) \\ 0 \end{Bmatrix} + \ldots + \begin{Bmatrix} +m_l(bit=0) \\ -m_l(bit=0) \\ 0 \end{Bmatrix}$$

$$\underline{m}_{=b2} = \begin{Bmatrix} +m_1(bit=0) \\ -m_1(bit=0) \\ 0 \end{Bmatrix} + \begin{Bmatrix} +m_2(bit=0) \\ -m_2(bit=0) \\ 0 \end{Bmatrix} + \ldots + \begin{Bmatrix} +m_l(bit=0) \\ -m_l(bit=0) \\ 0 \end{Bmatrix}$$

$$\ldots$$

$$\underline{m}_{=bl} = \begin{Bmatrix} +m_1(bit=0) \\ -m_1(bit=0) \\ 0 \end{Bmatrix} + \begin{Bmatrix} +m_2(bit=0) \\ -m_2(bit=0) \\ 0 \end{Bmatrix} + \ldots + \begin{Bmatrix} +m_l(bit=0) \\ -m_l(bit=0) \\ 0 \end{Bmatrix}$$

In OFDM (Orthogonal Frequency Division Multiplex) systems, the metrics are very often calculated based on symbols which have been constructed using BPSK (Binary Phase Shift Keying), QPSK (Quadrature Phase Shift Keying), QAM (Quadrature Amplitude Modulation)-16, QAM (Quadrature Amplitude Modulation)-64 or similar constellations. U.S. Pat. No. 5,742,621, 1998 (MOTOROLA) presents a very efficient implementation of the known BPSK/QPSK metrics:

TABLE 1

Metrics

| Constellation | Metric |
|---|---|
| BPSK | $m(b_1 = 0) = -m(b_1 = 1) = \text{sign}(\text{real}(z_1)) \cdot \text{real}(y_1 \cdot H_1^*)$ |
| QPSK | $m(b_1 = 0) = -m(b_1 = 1) = \text{sign}(\text{real}(z_1)) \cdot \text{real}(y_1 \cdot H_1^*)$ |
|  | $m(b_2 = 0) = -m(b_2 = 1) = \text{sign}(\text{imag}(z_1)) \cdot \text{imag}(y_1 \cdot H_1^*)$ |

In the example metrics of Table 1, $z_1$ is the complex transmitted symbol, $H_1^*$ is the complex conjugate of the channel coefficient and $y_1 = H_1 \cdot z_1 + v$ is the received complex symbol with $v$ being additive white gaussian noise (AWGN). For QAM-16, QAM-64, etc., similar metrics can be derived. These metrics are especially important in the framework of OFDM systems.

For this example, a code rate of $$R = \frac{1}{2},$$

a constraint length of K=7 and a convolutional encoder based on the generator polynomials $G_1 = 133_{OCT}$, $G_2 = 171_{OCT}$ is assumed. The non-optimised BPSK metrics may be defined for example as $m_{b1} = m_1(\text{bit}=0) + m_2(\text{bit}=0) = \text{sign}(\text{real}(z_1)) \cdot \text{real}(y_1 \cdot H_1^*) + \text{sign}(\text{real}(z_2)) \cdot \text{real}(y_2 \cdot H_2^*)$ $mb2 = m1(\text{bit}=1) + m2(\text{bit}=0) = -\text{sign}(\text{real}(z_1)) \cdot \text{real}(y_1 \cdot H_1^*) + \text{sign}(\text{real}(z_2)) \cdot \text{real}(y_2 \cdot H_2^*)$ $mb3 = m1(\text{bit}=0) + m2(\text{bit}=1) = \text{sign}(\text{real}(z_1)) \cdot \text{real}(y_1 \cdot H_1^*) - \text{sign}(\text{real}(z_2)) \cdot \text{real}(y_2 \cdot H_2^*)$ $mb4 = m1(\text{bit}=1) + m2(\text{bit}=1) = -\text{sign}(\text{real}(z_1)) \cdot \text{real}(y_1 \cdot H_1^*) - \text{sign}(\text{real}(z_2)) \cdot \text{real}(y_2 \cdot H_2^*)$ Choosing for example $m_a = m_{b1}$, the optimsed metrics are $$\underline{m}_{b1} = \frac{1}{2}(m_{b1} - m_{ba}) = 0$$

$$\underline{m}_{b2} = \frac{1}{2}(m_{b2} - m_{ba}) = -\text{sign}(\text{real}(z_1)) \cdot \text{real}(y_1 \cdot H_1^*)$$

$$\underline{m}_{b3} = \frac{1}{2}(m_{b3} - m_{ba}) = -\text{sign}(\text{real}(z_2)) \cdot \text{real}(y_2 \cdot H_2^*)$$

$$\underline{m}_{b4} = \frac{1}{2}(m_{b4} - m_{ba}) = -\text{sign}(\text{real}(z_1)) \cdot \text{real}(y_1 \cdot H_1^*) - \text{sign}(\text{real}(z_2)) \cdot \text{real}(y_2 \cdot H_2^*)$$

All $1-1=2^m-1$ non-zero metrics are pre-calculated by the Transition Metric Unit (TMU). Altogether there are $l=2^m$ different ACS butterflies (the two butterfly entries are not independent, which is why not all metric combinations are mixed and the number of different butterflies is limited to $l=2^m$). With K being the constraint length of the convolutional encoder, there are $$\frac{2^{K-1}}{2^m} = 2^{K-m-1}$$

ACS butterflies having a zero-metric as an input. Here, the new, optimised butterfly of FIG. 3 can be applied.

It should be noted that the new metrics $\underline{m}_{b1}, \underline{m}_{b2}, \underline{m}_{b3}, \underline{m}_{b4}$ are less complex (2 multiplications, 1 addition) than the classical ones $m_{b1}, m_{b2}, M_{b3}, M_{b4}$ (2 multiplications, 2 additions, 2 sign inversions).

The resulting four ACS butterflies are presented by FIG. 4 for a convolutional code of constraint length K=7 and for the metrics presented in Table 1.

In FIG. 4, the following notations have been used:

$b_{in} \epsilon(0,1)$ is the bit entering the convolutional encoder.

$X^1 \epsilon(0,1), \ldots, X^5 \epsilon(0,1)$ describe the state of the convolutional encoder.

$\underline{m}_{b1}, \ldots, \underline{m}_{b4}$ are the optimised metrics corresponding to the example of Table 1.

The boxes on the left side present the state of the convolutional encoder before the transition. The rightmost digit in each of these boxes represents the most significant bit (MSB).

The boxes on the right side present the state of the convolutional encoder after the transition.

FIG. 5 shows equivalent schematic representations of implementations of the four ACS butterflies of FIG. 4. As will be seen, the low complexity ACS butterflies Type I and Type II are similar to that of FIG. 3, and similar to each other (the input signals 'path metric 1' and 'path metric 2' being interchanged between the Type I and Type II butterflies). Also, as will be seen, the higher complexity ACS butterflies Type III and Type IV are similar to that of FIG. 2 and similar to each other (the input signals 'metric $\underline{m}_{b2}$' and 'metric $\underline{m}_{b3}$' being interchanged between the Type III and Type IV butterflies).

In the upper section, additive Gaussian noise of a constant mean noise power $\sigma_{noise}^2$ with a mean value $\mu_{noise}=0$ has been assumed. In the case of a non-zero mean value, the mean value $\mu_{noise} \neq 0$ is simply subtracted from the received symbols. Using the notations of example 1, the received symbol is in this case $$y_1 = [H_1 \cdot z_1 + v] - \mu_{noise} = H_1 \cdot z_1 + (v - \mu_{noise}).$$

Now, $(v - \mu_{noise})$ can be considered as zero-mean and the metrics can be used as before.

If the mean noise power depends on the received symbol $(\sigma_{noise}^2 \rightarrow |c_n|^2 \sigma_{noise}^2)$, the new metrics must be divided by the corresponding gain:

$$\underline{m}_{ba} \rightarrow \frac{\underline{m}_{ba}}{|c_{n(a)}|^2} \forall a.$$

Respecting these rules, the metrics can also be used in coloured noise environments.

In general, the placements of the different butterfly types are found by the following exhaustive search:

Create for all possible output-bit-combinations of the convolutional encoder a corresponding butterfly (as an example, see FIG. 4 and FIG. 5). Altogether, there are $l=2^m$ different butterflies.

Calculate for $2^K$ different buffer-states and input bits of the convolutional encoder the corresponding output bits of the convolutional encoder.

Find for each encoder state the butterfly type corresponding to the resulting output-bit-combination. If one of the input metrics is zero, take the optimised butterfly (FIG. 3). If both input metrics are non-zero, take the classical butterfly (FIG. 2).

Practically, the ACS structure can be exploited in different ways:

In a full-parallel hardware implementation, all ACS butterflies are implemented and hard-wired. Due to the fact that a certain number of the butterflies contain only two adders instead of four, the complexity is reduced.

In a software implementation, a subroutine corresponding to the different butterfly types may be called or the code for all butterflies (arranged in the correct order) is implemented sequentially. In this case, an important number of additions can be saved.

For both, hardware and software implementation, hybrid structures are possible where a certain number, but not all, classical and optimised butterflies are implemented. They are re-used once or several times during each trellis transition during the decoding.

Based on the exhaustive search proposed above, the four different ACS butterfly types shown in FIG. 4 and FIG. 5 are identified.

There are $2^{K-1}=64$ trellis states and correspondingly 64 path (or node) metric buffers. These buffers are connected to the ACS units as indicated by the following Table 2 (for the standard generator polynomials $G_1=133_{OCT}$, $G_2=171_{OCT}$ of the convolutional encoder used by the HIPERLAN/2 standard).

It will be understood that 50% of all butterflies are of the type I and II (low complexity) and the other 50% are of the type III and IV (classical butterflies), and that the total saving in complexity is approx. 8% compared to the total complexity of the classical Viterbi decoder.

TABLE 2

ACS inputs for 'HIPERLAN/2' Viterbi decoder

| Lower/Higher input state to ACS Unit, corresponding to $(X^1X^2X^3X^4X^50)_{bin}/$ $(X^1X^2X^3X^4X^51)_{bin}$ in decimal | Butterfly Type (see FIG. 4 and FIG. 5) | Output state |
|---|---|---|
| 0 and 32 | Butterfly Type I | 0 and 1 |
| 1 and 33 | Butterfly Type III | 2 and 3 |
| 2 and 34 | Butterfly Type II | 4 and 5 |
| 3 and 35 | Butterfly Type IV | 6 and 7 |
| 4 and 36 | Butterfly Type II | 8 and 9 |
| 5 and 37 | Butterfly Type IV | 10 and 11 |
| 6 and 38 | Butterfly Type I | 12 and 13 |
| 7 and 39 | Butterfly Type III | 14 and 15 |
| 8 and 40 | Butterfly Type I | 16 and 17 |
| 9 and 41 | Butterfly Type III | 18 and 19 |
| 10 and 42 | Butterfly Type II | 20 and 21 |
| 11 and 43 | Butterfly Type IV | 22 and 23 |
| 12 and 44 | Butterfly Type II | 24 and 25 |
| 13 and 45 | Butterfly Type IV | 26 and 27 |
| 14 and 46 | Butterfly Type I | 28 and 29 |
| 15 and 47 | Butterfly Type III | 30 and 31 |
| 16 and 48 | Butterfly Type IV | 32 and 33 |
| 17 and 49 | Butterfly Type II | 34 and 35 |
| 18 and 50 | Butterfly Type III | 36 and 37 |
| 19 and 51 | Butterfly Type I | 38 and 39 |
| 20 and 52 | Butterfly Type III | 40 and 41 |
| 21 and 53 | Butterfly Type I | 42 and 43 |
| 22 and 54 | Butterfly Type IV | 44 and 45 |
| 23 and 55 | Butterfly Type II | 46 and 47 |
| 24 and 56 | Butterfly Type IV | 48 and 49 |
| 25 and 57 | Butterfly Type II | 50 and 51 |
| 26 and 58 | Butterfly Type III | 52 and 53 |
| 27 and 59 | Butterfly Type I | 54 and 55 |
| 28 and 60 | Butterfly Type III | 56 and 57 |
| 29 and 61 | Butterfly Type I | 58 and 59 |
| 30 and 62 | Butterfly Type IV | 60 and 61 |
| 31 and 63 | Butterfly Type II | 62 and 63 |

In conclusion, it will be understood that the Viterbi decoder described above provides the following advantages:

Complexity Reduction of the Decoding Algorithm (at same error-correction performance)

Optimized solution for "Broadband Communications" applications, i.e., in the fastest implementation 1 bit can be decoded per clock cycle (in the case of an ASIC implementation) while being power-efficient Applicable for both, Hardware-and Software-Solutions A mixture between classical implementations and the proposed solution is possible ("hybrid solution").

The proposed technique may be used for any Viterbi decoder in general. However, it is especially interesting for OFDM systems, since the resulting optimised metrics do not require any additional precision, at least if the metric calculation is performed adequately, as presented by the example of Table 1.

The technique is especially interesting for a coding rate of R=½, since 50% of all ACS butterflies can be substituted by low-complexity, optimised ACS butterflies. For smaller coding rates, this percentage decreases exponentially.

The applications of the new method are principally found in high-speed applications where massive-parallel structures are required. Here, the savings in complexity/surface/power-consumption are maximal.

The invention claimed is:

1. A Viterbi decoder including a number of classical Add-Compare-Select units and a number of further Add-Compare-Select unit having a lower complexity butterfly unit (300) having only two adder means, such that the further Add-Compare-Select unit comprises:

first adder means (310) for receiving a first path metric and a branch metric and for producing at its output the addition thereof;

second adder means (320) for receiving a second path metric and said branch metric and for producing at its output the addition thereof;

first comparator means (330) coupled to receive the output of the second adder means and coupled to receive the first path metric for comparing therebetween;

second comparator means (340) coupled to receive the output of the first adder means and coupled to receive the second path metric for comparing therebetween;

first selection means (350) for selecting between the second adder means output and the first path metric to produce a first survivor path metric in dependence on the first comparator means comparison; and second selection means (360) for selecting between the first adder means output and the second path metric signal to produce a second survivor path metric in dependence on the second comparator means comparison, for processing metric transitions via the lower complexity butteffly unit only where a second branch metric is zero.

2. The Viterbi decoder of claim 1 adapted for code rates of the type R=k/m, where k>1, and k and m are integers.

3. A method of producing metrics for use in a Viterbi decoder comprising a number of classical Add-Compare-Select units having a butterfly unit and a number of further Add-Compare-Select unit(s) having a lower complexity butterfly unit (300) wherein the method comprises the step of:

determining when a branch metric is zero, and in response thereto the method comprises the steps of:

selecting the lower complexity butterfly unit (300) to perform only two adding steps comprising:

adding a first path metric and a branch metric to produce a first addition;

adding a second path metric and said branch metric to produce a second addition;

the method further comprising the steps of:

comparing the second addition and the first path metric to produce a first comparison;

comparing the first addition with the second path metric to produce a second comparison;

selecting between the second addition and the first path metric to produce a first survivor path metric in dependence on the first comparison; and selecting between the first addition and the second path metric to produce a second survivor path metric in dependence on the second comparison.

4. The method of claim 3 wherein the metrics are selected by subtracting from each of a predetermined set of metrics a chosen one thereof to produce a resultant set of metrics having at least one zero value for processing by the lower complexity butterfly unit (300).

5. The method of claim 3 further comprising re-adjusting the dynamic range of the selected metrics by multiplying each of the selected metrics by a scaling factor if the following property is satisfied:

$$m_a(\text{bit}=0)=-m_a(\text{bit}=1)\forall a.$$

6. The method of claim 5 adapted for Orthogonal Frequency Division Multiplexed (OFDM) coding.

7. The method of claim 5 further comprising adapting the selected metrics to additive noise.

8. The method of claim 7 wherein the additive noise comprises coloured noise.

9. The method of claim 3 adapted for code rates of the type R=k/m, where k>1, and k and m are integers.

10. A butterfly unit for use in a Viterbi decoder Add-Compare-Select unit, the butterfly unit (300) only two adder means comprising:

first adder means (310) for receiving a first path metric and a branch metric and for producing at its output the addition thereof;

second adder means (320) for receiving a second path metric and said branch metric and for producing at its output the addition thereof;

and further comprising first comparator means (330) coupled to receive the output of the second adder means and coupled to receive the first path metric for comparing therebetween;

second comparator means (340) coupled to receive the output of the first adder means and coupled to receive the second path metric for comparing therebetween;

first selection means (350) for selecting between the second adder means output and the first path metric to produce a first survivor path metric in dependence on the first comparator means comparison; and second selection means (360) for selecting between the first adder means output and the second path metric signal to produce a second survivor path metric in dependence on the second comparator means comparison.

11. The butterfly unit of claim 10 adapted for code rates of the type R=k/m, where k>1, and k and m are integers.

* * * * *

UNITED STATES PATENT AND TRADEMARK OFFICE
CERTIFICATE OF CORRECTION

PATENT NO. : 7,042,964 B2
APPLICATION NO. : 10/023543
DATED : December 17, 2001
INVENTOR(S) : Markus Muck It is certified that error appears in the above-identified patent and that said Letters Patent is hereby corrected as shown below:

In Column 11, Line 29, Claim No. 10:

Change "butterfly unit (300) only" to -- butterfly unit (300) comprising only --

Signed and Sealed this

Sixteenth Day of September, 2008

JON W. DUDAS
*Director of the United States Patent and Trademark Office*

UNITED STATES PATENT AND TRADEMARK OFFICE
CERTIFICATE OF CORRECTION

PATENT NO. : 7,042,964 B2 Page 1 of 1
APPLICATION NO. : 10/023543
DATED : May 9, 2006
INVENTOR(S) : Markus Muck It is certified that error appears in the above-identified patent and that said Letters Patent is hereby corrected as shown below:

In Column 11, Line 29, Claim No. 10:

Change "butterfly unit (300) only" to -- butterfly unit (300) comprising only --

This certificate supersedes the Certificate of Correction issued September 16, 2008.

Signed and Sealed this

Seventh Day of October, 2008

JON W. DUDAS
*Director of the United States Patent and Trademark Office*